United States Patent
Lu et al.

(10) Patent No.: US 11,715,483 B2
(45) Date of Patent: Aug. 1, 2023

(54) SELF-VOICE ADAPTATION

(71) Applicant: Apple Inc., Cupertino, CA (US)

(72) Inventors: Yang Lu, Cupertino, CA (US); Fatos Myftari, San Jose, CA (US); Vasu Iyengar, Pleasanton, CA (US); Aram M. Lindahl, Menlo Park, CA (US)

(73) Assignee: Apple Inc., Cupertino, CA (US)

(*) Notice: Subject to any disclaimer, the term of this patent is extended or adjusted under 35 U.S.C. 154(b) by 25 days.

(21) Appl. No.: 16/899,474

(22) Filed: Jun. 11, 2020

(65) Prior Publication Data
US 2021/0390972 A1    Dec. 16, 2021

(51) Int. Cl.
G10L 21/034      (2013.01)
G10L 21/0208     (2013.01)
G10K 11/178      (2006.01)
H03G 3/30        (2006.01)
H04R 1/10        (2006.01)

(52) U.S. Cl.
CPC ...... *G10L 21/034* (2013.01); *G10K 11/17853* (2018.01); *G10L 21/0208* (2013.01); *H03G 3/301* (2013.01); *H04R 1/1091* (2013.01); *G10K 2210/1081* (2013.01); *G10K 2210/3218* (2013.01); *H04R 2460/01* (2013.01)

(58) Field of Classification Search
CPC .............. G10L 21/034; G10L 21/0208; G10K 11/17853; G10K 2210/1081; G10K 2210/3218; H03G 3/301; H04R 1/1091; H04R 2460/01

USPC ......................................... 381/57, 71.6, 309
See application file for complete search history.

(56) References Cited

U.S. PATENT DOCUMENTS

| | | | |
|---|---|---|---|
| 9,325,821 B1* | 4/2016 | Hendrix | H04R 29/00 |
| 2003/0228013 A1 | 12/2003 | Etter | |
| 2009/0190772 A1* | 7/2009 | Osada | H04R 3/04 |
| | | | 381/73.1 |
| 2011/0299695 A1 | 12/2011 | Nicholson | |
| 2014/0270224 A1* | 9/2014 | Zhou | G10K 11/17885 |
| | | | 381/71.6 |
| 2015/0271602 A1* | 9/2015 | Gauger, Jr. | A61F 11/14 |
| | | | 381/309 |
| 2016/0323454 A1* | 11/2016 | Kim | H04R 3/04 |
| 2017/0213537 A1* | 7/2017 | Magrath | G10K 11/17875 |
| 2017/0214997 A1* | 7/2017 | Kaller | H04M 1/58 |
| 2018/0182411 A1* | 6/2018 | Kaskari | G10L 21/0264 |
| 2018/0357996 A1* | 12/2018 | Fink | G10K 11/17853 |
| 2019/0058952 A1* | 2/2019 | Nawfal | H04R 5/04 |
| 2019/0272843 A1* | 9/2019 | Thorpe | G10L 21/0232 |
| 2020/0302946 A1* | 9/2020 | Jhawar | G10L 21/02 |
| 2022/0086574 A1* | 3/2022 | Denda | H04R 25/75 |

* cited by examiner

*Primary Examiner* — Vivian C Chin
*Assistant Examiner* — Friedrich Fahnert
(74) *Attorney, Agent, or Firm* — BakerHostetler

(57) ABSTRACT

Aspects of the subject technology relate to a device including a microphone, a filter and a processor. The filter receives an audio signal including ambient noise and a voice of a user of the device from the microphone. At least a portion of ambient noise is filtered from the audio signal. The processor determines a level of the ambient noise in the received audio signal and dynamically adjusts a gain applied to the filtered audio signal based on the level of the ambient noise.

20 Claims, 7 Drawing Sheets

SELF-VOICE ADAPTATION

TECHNICAL FIELD

The present description relates generally to audio processing and more particularly, but not exclusively, to audio processing for self-voice adaptation.

BACKGROUND

With mobile phones, in order to make it more comfortable for a user talking on a phone, a provision is made for the user to hear a weak version of her/his own voice, which is referred to as sidetone. The purpose of the sidetone, which is usually provided at a fairly low volume, is to allow a caller to get a sense of the volume of her/his voice. When the microphone is too close to the speaker, the sidetone may cause unwanted feedback (echo).

BRIEF DESCRIPTION OF THE DRAWINGS

Certain features of the subject technology are set forth in the appended claims. However, for purposes of explanation, several aspects of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block-diagram form in order to avoid obscuring the concepts of the subject technology.

When a user of a mobile device uses a headphone or an earbud, the user may have very little feedback from her/his own voice. For example, noise-controlled headsets and/or headphones have provisions for controlling the ambient noise that can also muffle or reduce the user's own voice while keeping the ambient noise low during a phone call (and/or other audio communication sessions). The phone call may sound unnatural and/or unusual to the user when they cannot hear their own voice. However, allowing a sidetone (including the user's voice) to pass through the audio path may result in a loss and/or degradation of the active noise cancellation.

The subject technology is directed to self-voice adaptation, where the ambient noise level, excluding the speech signal, is tracked and used to set the sidetone level. For example, during a high level of ambient noise, the user may prefer to have the noise reduced rather than hear her/his own voice, e.g., the user may not notice their own voice during high levels of ambient noise. On the other hand, when the level of the ambient noise is low, the user may have interest in hearing their voice as the user's voice may be more noticeable during low levels of ambient noise. The subject technology tracks and analyzes the ambient noise and adjusts the level of the sidetone (that includes the user's voice) based on the result of the analysis. For instance, when the ambient noise level is below a predefined level, the level of the sidetone is set to a higher value than when the ambient noise level is high.

Figure 1:
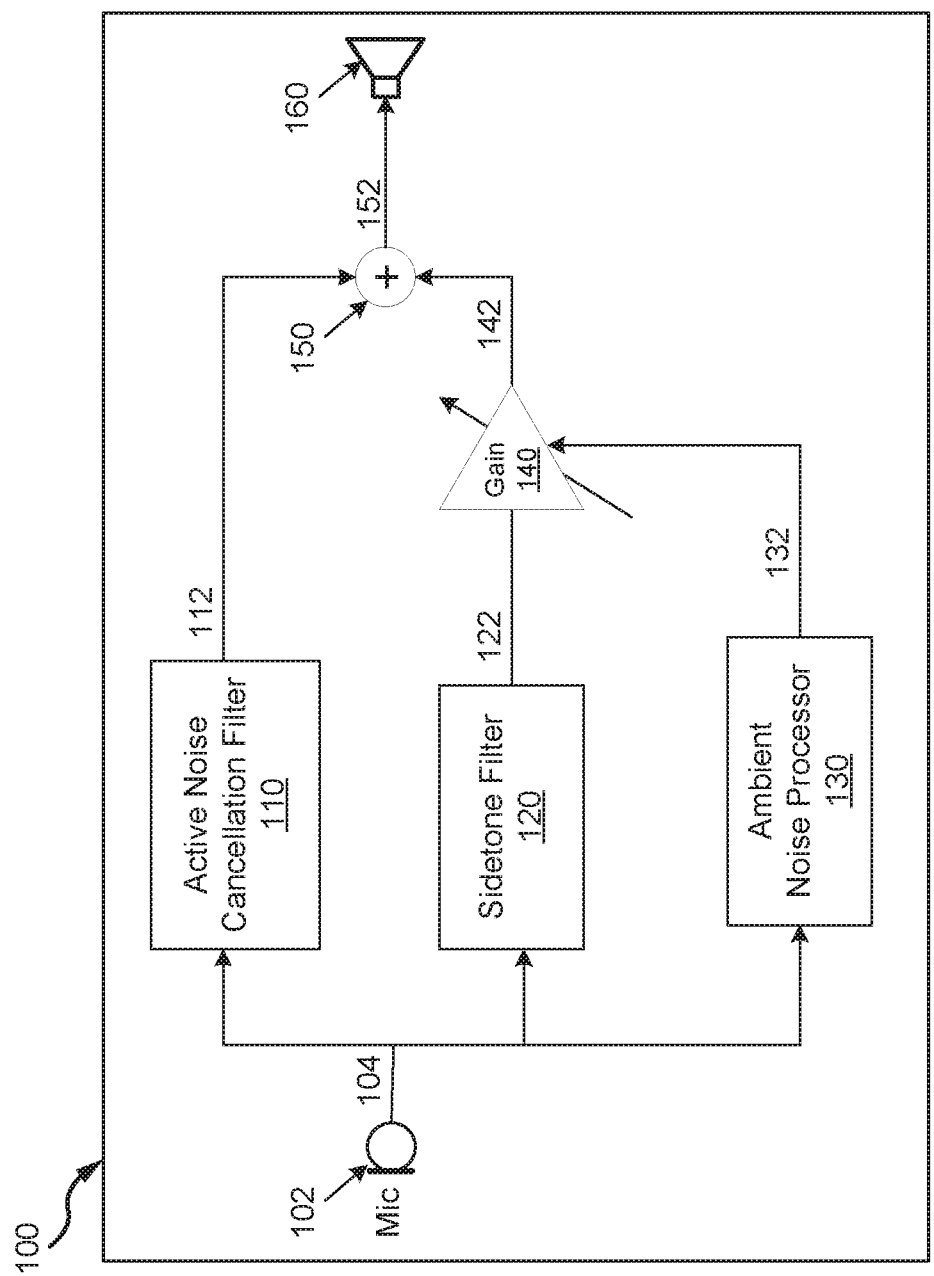
FIG. 1 illustrates a high-level block diagram of an example of a device with self-voice adaptation, in accordance with various aspects of the subject technology.

FIG. 1 illustrates a high-level block diagram of an example of a device 100 with self-voice adaptation, in accordance with various aspects of the subject technology. The device 100 includes a microphone (Mic) 102, an active noise cancellation filter 110, a sidetone filter 120, an ambient noise processor 130, a gain stage 140, a summing circuit 150 and a speaker 160. In one or more implementations, the device 100 can be a headset or an earbud that is coupled, wirelessly or via a wired link, to a handheld device, such as a smartphone, a smartwatch or a tablet, or to a computing device such as a laptop or desktop computer.

The device 100 has an active noise cancellation feature that is supported by the active noise cancellation filter 110. The active noise cancellation filter 110 is a variation of optimal filtering that can produce an estimate of the noise by filtering the input signal 104 received from the microphone 102 and then subtracting the estimated noise from the input signal 104. An estimate of the noise can be produced, for example, by adaptive prediction or by using a prediction filter that exploits a low-pass characteristic of the input signal 104. In one or more implementations, the active noise cancellation filter 110 can be implemented at least partially in hardware, firmware or software. The output of the active noise cancellation filter 110 is a substantially noise-free audio signal 112. In some aspects, the active noise cancellation filter 110 may not be able to distinguish between the noise and the user's self-voice. Therefore, the user's self-voice may be at least partially removed as well.

The sidetone filter 120 is used to filter the noise from the input signal 104 received from the microphone 102, for example, the ambient noise, and to produce an audio signal 122 that replicates the voice of a user speaking to the microphone. In some implementations of the subject technology, the sidetone filter 120 can sample the input signal 104 at a very high rate (e.g., thousands of samples per second). The audio signal 122 of the sidetone filter 120 is amplified by the gain stage 140, which is a variable gain amplifier. The variable gain of the gain stage 140 is controlled via a control signal 132 produced by the ambient noise processor 130.

The ambient noise processor 130 receives and analyzes the input signal 104 from the microphone 102, estimates the level of ambient noise in the input signal 104, and produces the control signal 132 based on the level of the estimated ambient noise. For example, when the level of the ambient noise is high, such as above a preset threshold (e.g., 65 dB sound-pressure level (SPL)), the gain of the gain stage 140 is set to a lower value (e.g., −40 dB). This is because the user may prefer to have the noise reduced rather than hear her/his own voice. In one or more implementations, the ambient noise processor 130 may use different threshold values to set the gain of the gain stage 140. For example, the ambient noise processor 130 may set the gain of the gain stage 140 to a medium level (e.g., −36 dB) when the level of ambient noise is in a medium range (e.g., between 55-65 dB SPL) and set the gain of the gain stage 140 to a higher level (e.g., −32 dB) when the level of ambient noise is low (e.g., less than 55 dB SPL). This feature of the subject technology may result in an improved user experience during phone calls (and/or other communication sessions), as the user is allowed to hear more of their own voice during the phone call when the ambient noise level is low.

In one or more implementations, the ambient noise processor 130 is implemented at least partially by hardware, firmware, or software. In some implementations, some of the functionalities of ambient noise processor 130 can be performed by a processor of a host device, such as a smartphone or a smartwatch. The summing circuit 150 adds the amplified audio signal 142 of the gain stage 140 to the noise-free audio signal 112 and provides an audio signal 152 to the speaker 160. The audio signal 152 includes the noise-free audio from the microphone 102 and the self-voice of the user at a controlled level, based on the level of the ambient noise in the input signal 104.

Figure 2:
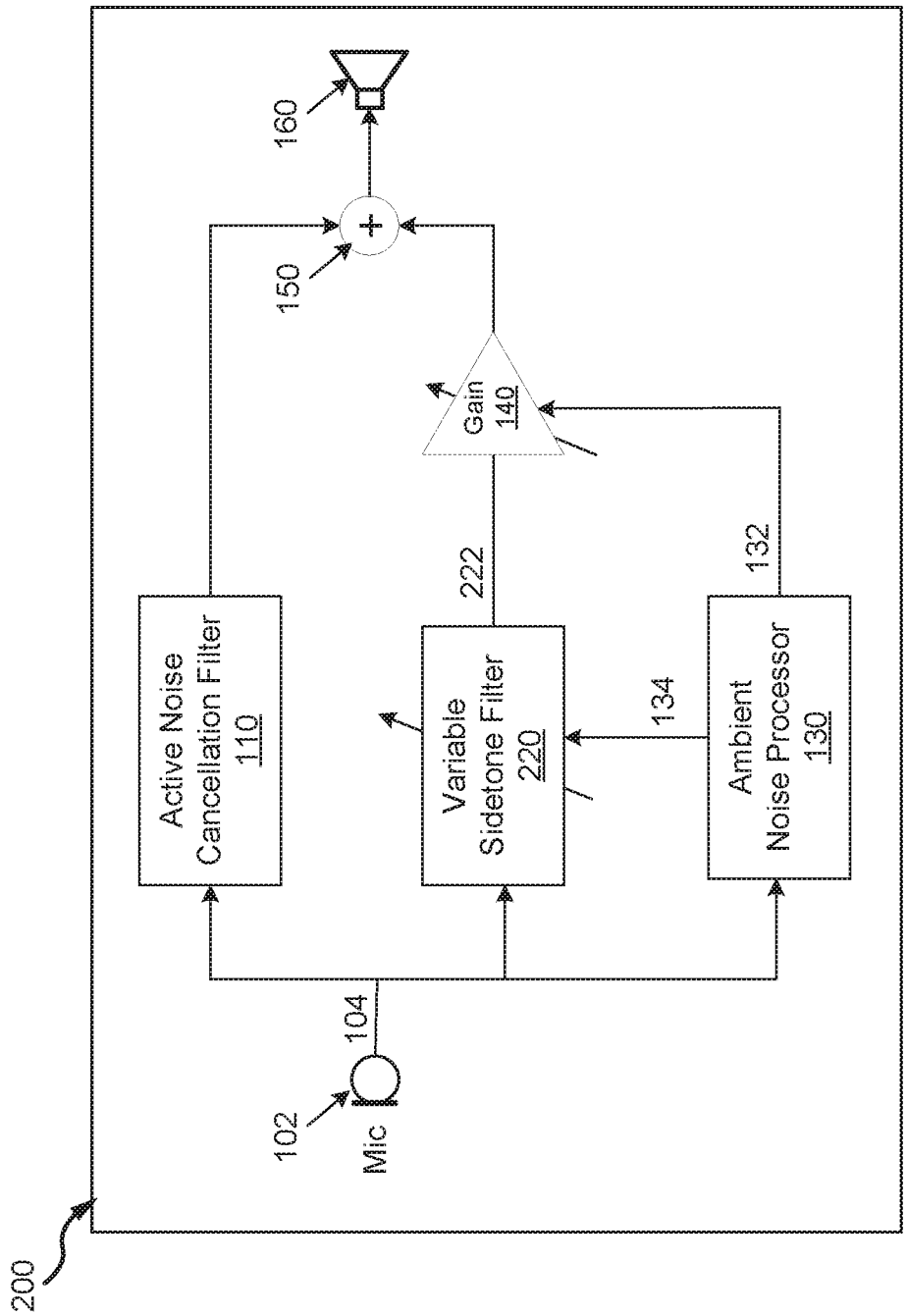
FIG. 2 illustrates a high-level block diagram of an example of a device with self-voice adaptation, in accordance with various aspects of the subject technology.

FIG. 2 illustrates a high-level block diagram of an example of a device 200 with self-voice adaptation, in accordance with various aspects of the subject technology. The device 200 includes the microphone 102, the active noise cancellation filter 110, a variable sidetone filter 220, the ambient noise processor 130, the gain stage 140, the summing circuit 150 and the speaker 160. In one or more implementations, the device 200 can be a headset or an earbud that is coupled, wirelessly or via a wired link, to a handheld device, such as a smartphone, a smartwatch or a tablet, or to a computing device such as a laptop or desktop computer.

The descriptions of the active noise cancellation filter 110, the ambient noise processor 130, the gain stage 140, the summing circuit 150 and the speaker 160 are the same as provided with respect to FIG. 1 and are skipped here for brevity. The variable sidetone filter 220 is different from the sidetone filter 120 of FIG. 1 in the sense that it has variable frequency characteristics, which can include specifics of a passband such as a mid-band frequency and a bandwidth or the lower and/or the upper frequencies of the passband or other frequency characteristics.

In some implementations, the frequency characteristics of the variable sidetone filter 220 can be controlled by a control signal 134 provided by the ambient noise processor 130. In other words, the ambient noise processor 130 can estimate a level and a frequency spectrum of the ambient noise in the input signal 104 and, based on the estimated ambient noise level and frequency spectrum, generate the control signals 132 and 134. The control signal 132 controls the gain of the gain stage 140 to provide a suitable self-voice level based on the level of ambient noise, as discussed above with respect to FIG. 1. The control signal 134 controls the frequency characteristics of the variable sidetone filter 220 based on the estimated frequency spectrum of the ambient noise. This enables the variable sidetone filter 220 to be more effective in distinguishing the user's self-voice from the ambient noise and to provide a rather noise-free self-voice signal 222 to the gain stage 140.

Figure 3:
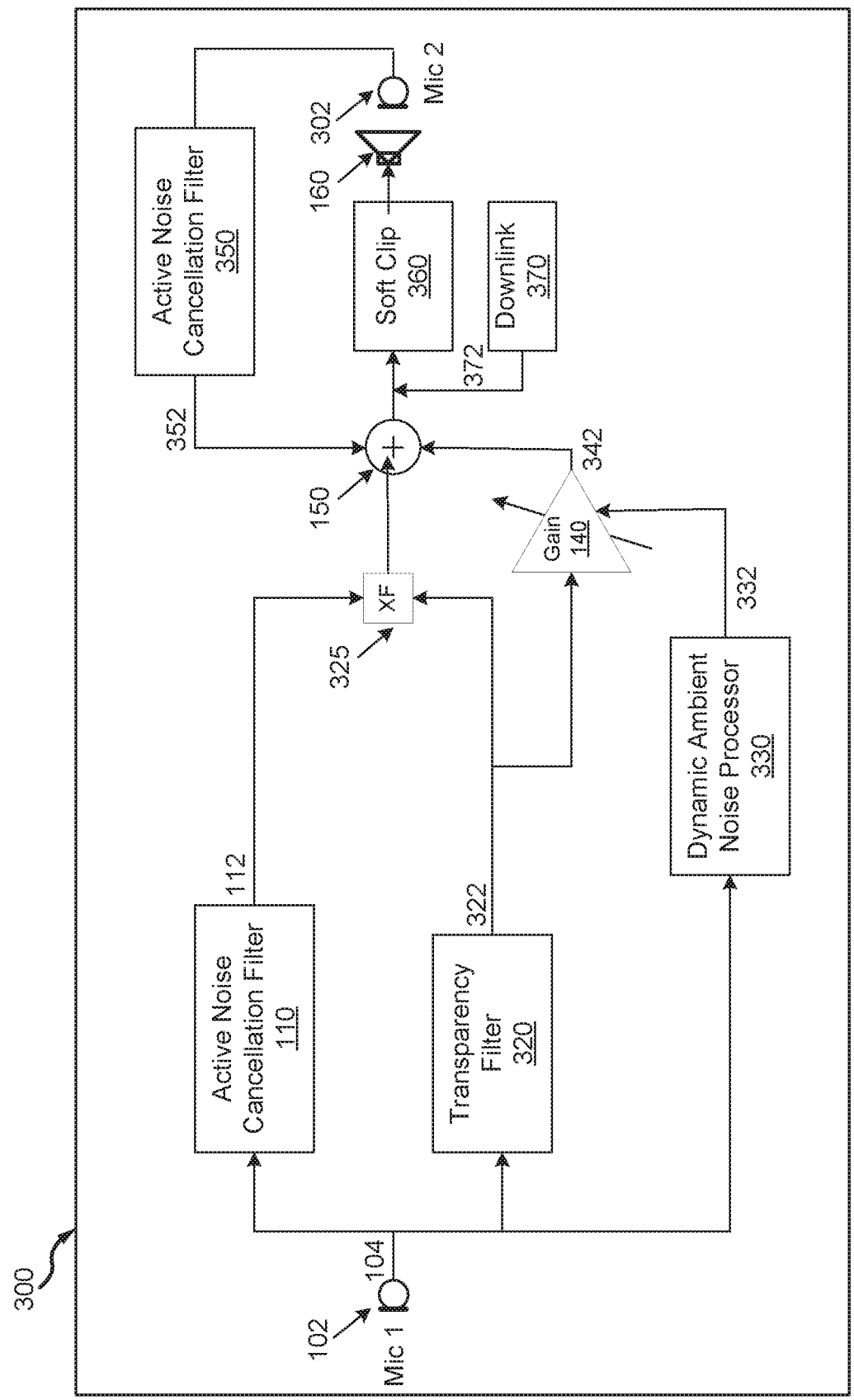
FIG. 3 illustrates a block diagram of an example of a device with self-voice adaptation based on the ambient noise level, in accordance with various aspects of the subject technology.

FIG. 3 illustrates a block diagram of an example of a device 300 with self-voice adaptation based on the ambient noise level, in accordance with various aspects of the subject technology. The device 300 includes the microphone 102 (Mic 1), the active noise cancellation filter 110, a transparency filter 320, the ambient noise processor 130, the gain stage 140, a cross fader 325, the summing circuit 150, an active noise cancellation filter 350, a soft clip 360, a downlink 370, the speaker 160 and a microphone 302 (Mic 2). In one or more implementations, the device 300 can be a headset or an earbud that is coupled, wirelessly or via a wired link, to a handheld device, such as a smartphone, a smartwatch or a tablet, or to a computing device such as a laptop or desktop computer.

The descriptions of the active noise cancellation filter 110, gain stage 140 and the summing circuit 150 are the same as discussed with respect to FIG. 1 and are skipped herein for brevity. The transparency filter 320 can analyze the input signal 104 received from the microphone 102 and reproduce an ambient sound environment 322 by suitably filtering the ambient noise components of the input signal 104. Examples of the ambient sound environment 322 include, announcements at a sports field or a speech broadcasted over a loudspeaker. Furthermore, when the user is speaking, the ambient sound environment 322 may include the user's voice. The acoustical transparency (also referred to as transparent hearing, or hear-through mode) function may be desirable in some usage scenarios to reproduce the ambient sound environment through the earpiece speaker drivers of the headset.

In some implementations, a data processor may perform an algorithm that adjusts the filters of the transparency filter 320 and reduces the acoustic occlusion due to an earpiece of the headset, while also preserving the spatial filtering effect of the wearer's anatomical features (e.g., head, pinna, shoulder). The filters may help preserve the timbre and spatial cues associated with the actual ambient sound.

As described above with respect to FIG. 1, the output of the active noise cancellation filter 110 is a substantially noise-free audio signal 112, which is mixed with the surround sound 322 by the cross-fader (XF) 325. In mixing the noise-free audio signal 112 and the surround sound 322, the XF 325 may allow the level of the former to fade in while the level of the latter fades out, or vice versa. The ambient sound environment 322 is amplified by the gain stage 140, the gain of which is controlled by the control signal 332 of the dynamic ambient noise processor 330.

The dynamic ambient noise processor 330 analyzes the ambient noise level of the input signal 104, estimates the level of the ambient noise and produces the control signal 332 based on the level of the estimate of the ambient noise. Therefore, the ambient sound environment 322 is amplified by the gain stage 140 having a gain that is controlled based on the ambient noise. That is to say, if the level of the ambient noise is high, the ambient sound environment 322 including the user's voice when speaking may be amplified with a higher gain so that the ambient noise can be overcome. The dynamic ambient noise processor 330 can periodically estimate the level of the ambient noise. The dynamic nature of the dynamic ambient noise processor 330 enables operation in an environment that the level and nature of surround sound may vary with time.

The summing circuit 150 mixes the output of the XF 325 and the amplified surround sound 342 with a feedback signal 352. The feedback signal 352 is generated by the active noise cancellation filter 350, which is similar to the active noise cancellation filter 110, and can filter noise of an audio signal produced by the microphone 302. The microphone 302 is located close to the speaker 160 and can pick up an output of the speaker 160, which receives mixed audio signals including an output of the summing circuit 150 and a downlink signal 372 through the soft clip 360. The downlink signal 372 is generated by the downlink 370, which receives an audio output from another speaker (e.g., a right/left speaker of a stereo headset, not shown for simplicity). The soft clip 360 can create a type of distortion effect where the signal amplitude is saturated along a smooth curve, rather than the abrupt shape used in hard-clipping.

Figure 4:
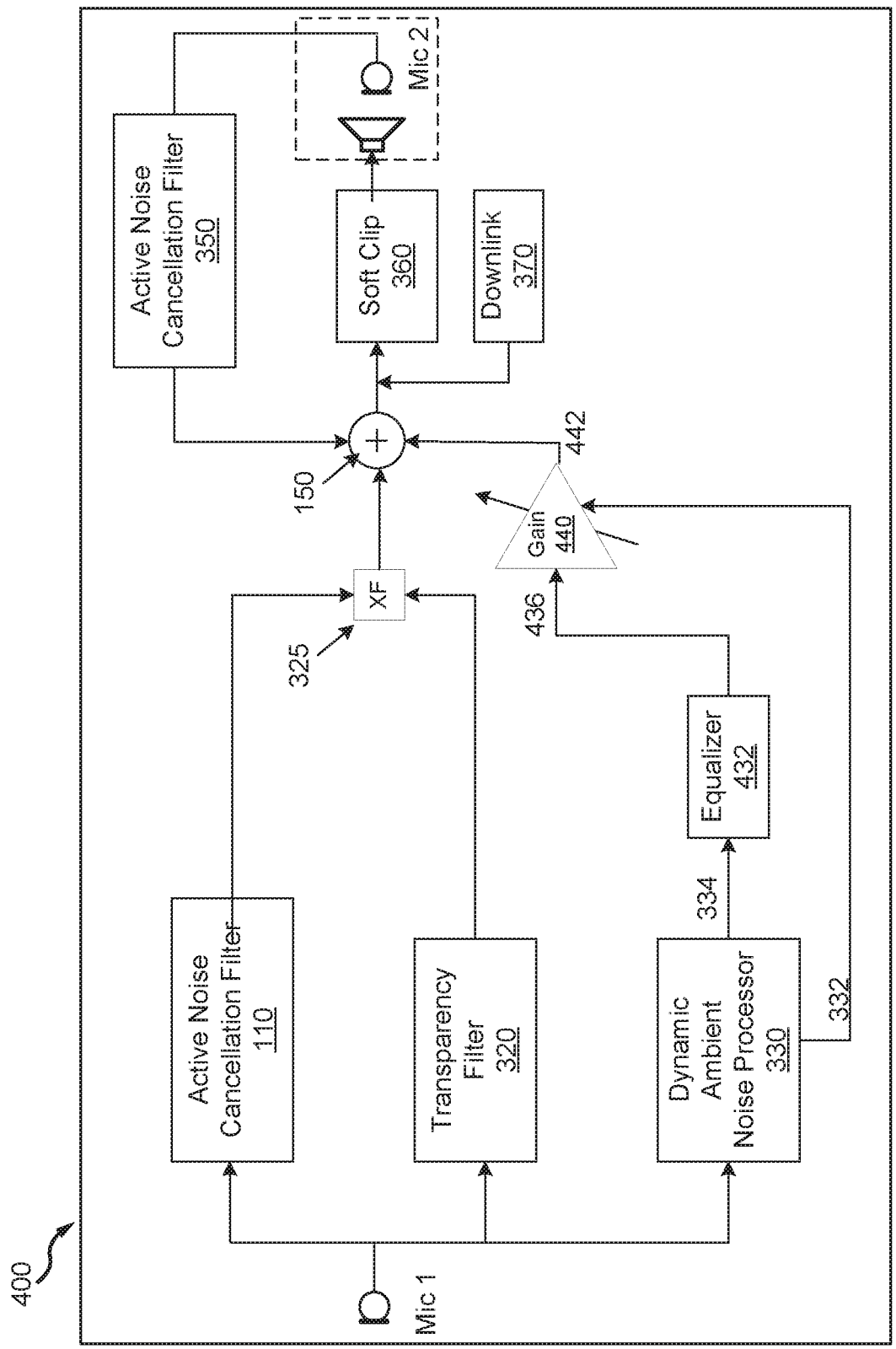
FIG. 4 illustrates a block diagram of an example of a device with self-voice adaptation based on the ambient noise level, in accordance with various aspects of the subject technology.

FIG. 4 illustrates a schematic diagram of an example of a device 400 with self-voice adaptation based on the ambient noise level, in accordance with various aspects of the subject technology. The device 400 is similar to the device 300 of FIG. 3, except that an equalizer 432 is added after the dynamic ambient noise processor 330, and the input signal of the gain stage 440 is received from the equalizer 432 rather than the transparency filter 320. The dynamic ambient noise processor 330 not only produces the control signal 332 that controls the gain of the gain stage 440 based on the level of the ambient noise, as described above with respect the FIG. 3, but it also provides the sidetone signal 334 to the equalizer 432.

The equalizer 432 performs the process of adjusting the balance between frequency components of the sidetone signal 334 by strengthening or weakening the energy of specific frequency bands of the sidetone signal 334 to provide a filtered sidetone signal 436 as the input signal to the gain stage 440. The output signal 442 of the gain stage 440 is an amplified version of the filtered sidetone signal 436, which is amplified based on the level of the ambient noise. For example, if the level of the ambient noise is lower than a threshold value, the gain of the gain stage 440 is set to a higher value, as the user prefers to hear more of her/his own voice while on a call when the noise level is low. In some implementations, the gain of the gain stage 440 can be set using a look-up table (LUT).

The descriptions of the functionalities of the active noise cancellation filters 110 and 350, the transparency filter 320, the XF 325, the summing circuit 150, the soft clip 360 and the downlink 370 are similar to the descriptions provided with respect to FIG. 3 and are skipped herein for brevity.

Figure 5:
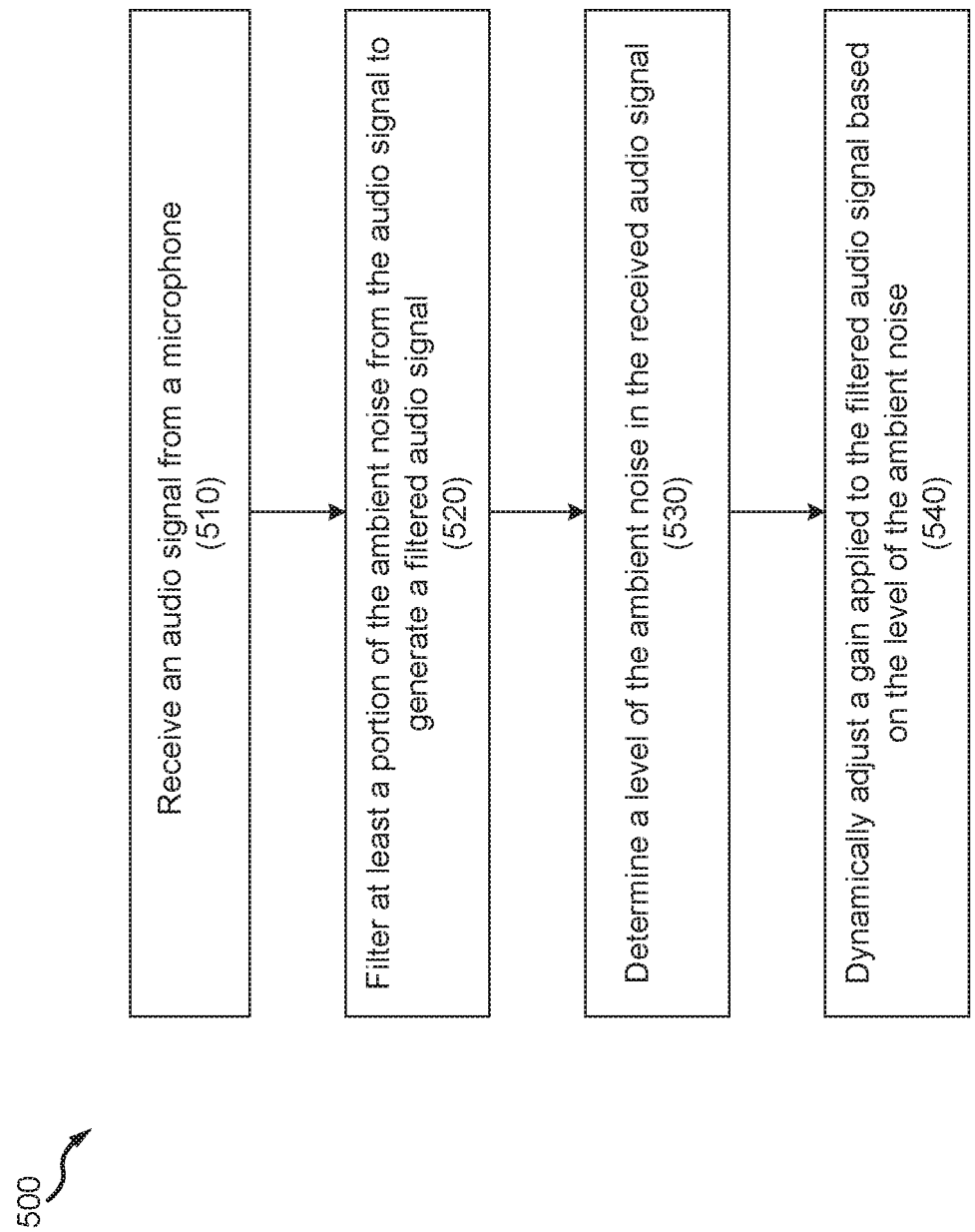
FIG. 5 illustrates a flow diagram of an example process of self-voice adaptation, in accordance with various aspects of the subject technology.

FIG. 5 illustrates a flow diagram of an example process 500 of self-voice adaptation, in accordance with various aspects of the subject technology. For explanatory purposes, the process 500 is primarily described herein with reference to the device 100 of FIG. 1. However, the process 500 is not limited to the device 100 of FIG. 1, and one or more blocks (or operations) of the process 500 may be performed by one or more other components of other suitable devices, such as earbuds, headphones, headsets, and the like. Further for explanatory purposes, the blocks of the process 500 are described herein as occurring in serial, or linearly. However, multiple blocks of the process 500 may occur in parallel. In addition, the blocks of the process 500 need not be performed in the order shown and/or one or more blocks of the process 500 need not be performed and/or can be replaced by other operations.

The process 500 includes receiving an audio signal (e.g., 104 of FIG. 1) corresponding to a microphone (e.g., 102 of FIG. 1) (510). The audio signal includes ambient noise and one or more audio components. At least a portion of the ambient noise is filtered (e.g., by 102 of FIG. 1) from the audio signal to generate a filtered audio signal (e.g., 122 of FIG. 1) (520). A level of the ambient noise in the received audio signal is determined (530). A gain applied (e.g., by 140 of FIG. 1) to the filtered audio signal is dynamically adjusted based on the level of the ambient noise (540).

Figure 6:
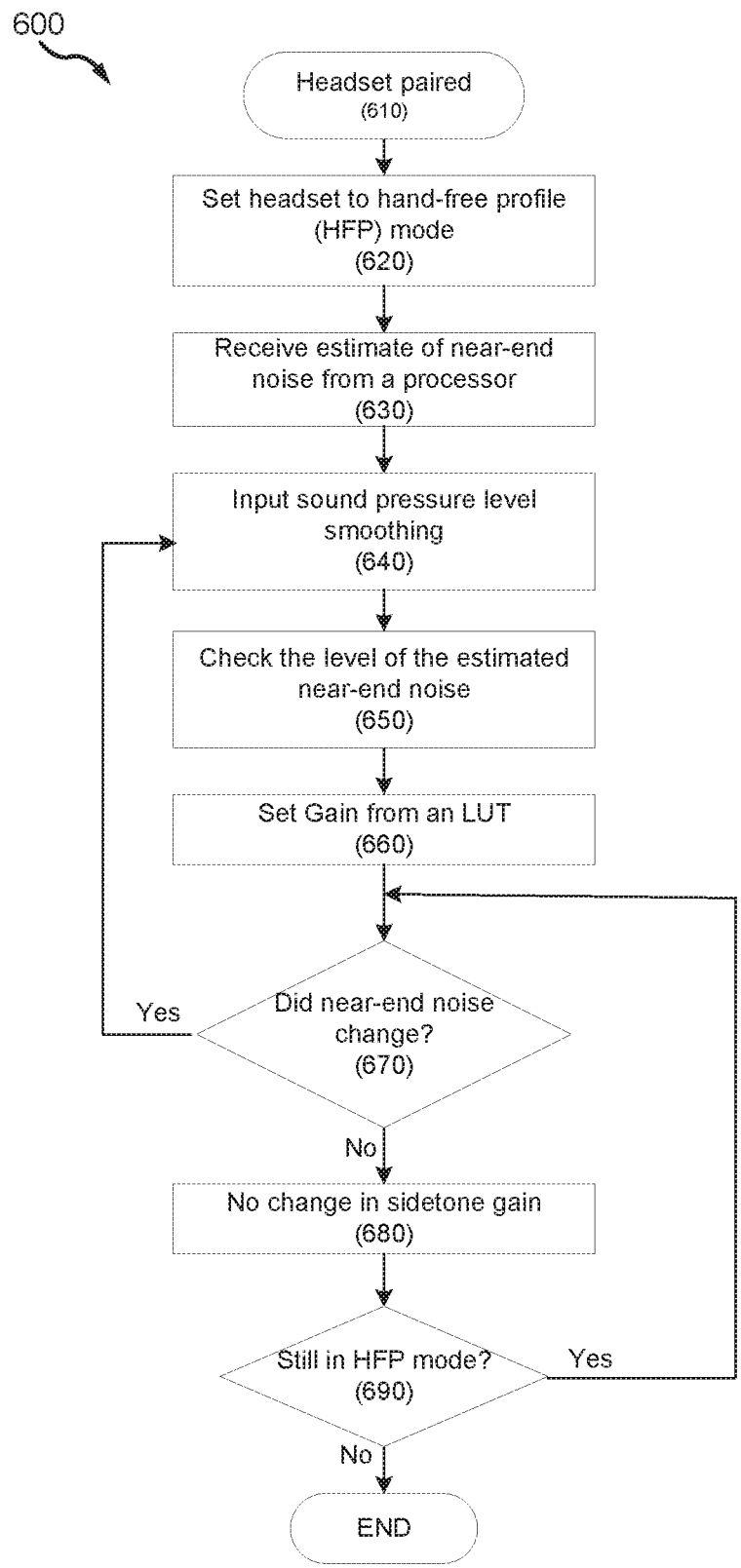
FIG. 6 illustrates a flow diagram of another example process of self-voice adaptation, in accordance with various aspects of the subject technology.

FIG. 6 illustrates a flow diagram of an example process 600 of self-voice adaptation, in accordance with various aspects of the subject technology. For explanatory purposes, the process 600 is primarily described herein with reference to the device 100 of FIG. 1. However, the process 600 is not limited to the device 100 of FIG. 1, and one or more blocks (or operations) of the process 600 may be performed by one or more other components of other suitable devices, such as earbuds, headphones, headsets, and the like. Further for explanatory purposes, the blocks of the process 600 are described herein as occurring in serial, or linearly. However, multiple blocks of the process 600 may occur in parallel. In addition, the blocks of the process 600 need not be performed in the order shown and/or one or more blocks of the process 600 need not be performed and/or can be replaced by other operations.

The process 600 begins when the device 100, such as a headset, determines whether it is paired with a handheld communication device, such as a smartphone or a smartwatch of a user of the headset (610). Next, the headset is set to a hand-free profile (HPF) mode (620), and an estimate of the near-end noise is received from a processor (e.g., 130 of FIG. 2) (630). Next, the input-sound pressure level (SPL) smoothing is performed by a variable sidetone filter (e.g., by 220 of FIG. 2) (640).

The sidetone gain of a gain stage (e.g., 140 of FIG. 1) is set by using an LUT (660). Then, it is checked whether the near-end noise has changed from a previous estimated value (670). If no change is observed, the sidetone gain of the gain stage remains unchanged, and control is passed to the operation block 690 (680). If, at operation block 670, it is determined that the near-end noise has changed, control is passed to operation block 640. Next, it is checked whether the headset is still in HPF mode (690). If the headset is still in HPF mode, control is passed to operation block 670. If the headset is not in HPF mode any longer, the process 600 ends.

Figure 7:
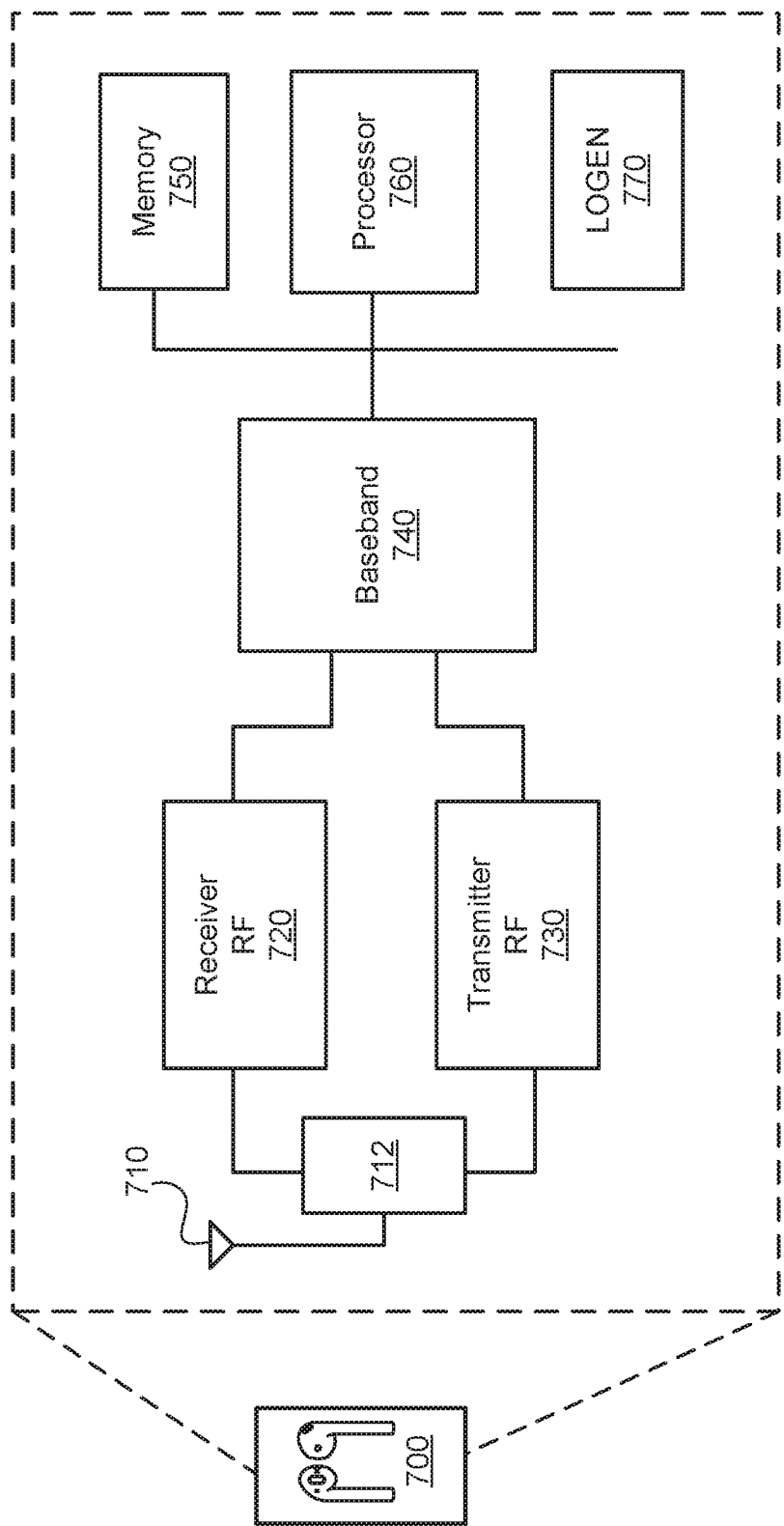
FIG. 7 illustrates a wireless communication device within which some aspects of the subject technology are implemented.

FIG. 7 illustrates a wireless communication device 700 within which some aspects of the subject technology are implemented. In one or more implementations, the wireless communication device 700 can be a headset or an earbud device of the subject technology, for example, any of the devices 100, 200, 300 or 400 of FIG. 1, 2, 3 or 4. The wireless communication device 700 may comprise a radiofrequency (RF) antenna 710, a duplexer 712, a receiver 720, a transmitter 730, a baseband processing module 740, a memory 750, a processor 760 and a local oscillator generator (LOGEN) 770. In various aspects of the subject technology, one or more of the blocks represented in FIG. 7 may be integrated on one or more semiconductor substrates. For example, the blocks 720-770 may be realized in a single chip or a single system on a chip, or may be realized in a multichip chipset.

The receiver 720 may comprise suitable logic circuitry and/or code that may be operable to receive and process signals from the RF antenna 710. The receiver 720 may, for example, be operable to amplify and/or down-convert received wireless signals. In various aspects of the subject technology, the receiver 720 may be operable to cancel noise in received signals and may be linear over a wide range of frequencies. In this manner, the receiver 720 may be suitable for receiving signals in accordance with a variety of wireless standards, such as Wi-Fi, WiMAX, Bluetooth, and various cellular standards. In various aspects of the subject technology, the receiver 720 may not use any sawtooth acoustic wave (SAW) filters and few or no off-chip discrete components such as large capacitors and inductors.

The transmitter 730 may comprise suitable logic circuitry and/or code that may be operable to process and transmit signals from the RF antenna 710. The transmitter 730 may, for example, be operable to upconvert baseband signals to RF signals and amplify RF signals. In various aspects of the subject technology, the transmitter 730 may be operable to upconvert and amplify baseband signals processed in accordance with a variety of wireless standards. Examples of such standards may include Wi-Fi, WiMAX, Bluetooth, and various cellular standards. In various aspects of the subject technology, the transmitter 730 may be operable to provide signals for further amplification by one or more power amplifiers.

The duplexer 712 may provide isolation in the transmit band to avoid saturation of the receiver 720 or damaging parts of the receiver 720, and to relax one or more design requirements of the receiver 720. Furthermore, the duplexer 712 may attenuate the noise in the receive band. The duplexer 712 may be operable in multiple frequency bands of various wireless standards.

The baseband processing module 740 may comprise suitable logic, circuitry, interfaces, and/or code that may be operable to perform the processing of baseband signals. The baseband processing module 740 may, for example, analyze received signals and generate control and/or feedback signals for configuring various components of the wireless communication device 700, such as the receiver 720. The baseband processing module 740 may be operable to encode, decode, transcode, modulate, demodulate, encrypt, decrypt, scramble, descramble, and/or otherwise process data in accordance with one or more wireless standards.

The processor 760 may comprise suitable logic, circuitry, and/or code that may enable processing data and/or controlling operations of the wireless communication device 700. In this regard, the processor 760 may be enabled to provide control signals to various other portions of the wireless communication device 700. The processor 760 may also control transfer of data between various portions of the wireless communication device 700. Additionally, the processor 760 may enable implementation of an operating system or otherwise execute code to manage operations of the wireless communication device 700. In one or more implementations, the processor 760 can be used to perform some of the functionalities of the subject technology.

The memory 750 may comprise suitable logic, circuitry, and/or code that may enable storage of various types of information such as received data, generated data, code, and/or configuration information. The memory 750 may comprise, for example, RAM, ROM, flash, and/or magnetic storage. In various aspects of the subject technology, information stored in the memory 750 may be utilized for configuring the receiver 720 and/or the baseband processing module 740. In some implementations, the memory 750 may store image information from processed and/or unprocessed fingerprint images of the under-display fingerprint sensor of the subject technology.

The LOGEN 770 may comprise suitable logic, circuitry, interfaces, and/or code that may be operable to generate one or more oscillating signals of one or more frequencies. The LOGEN 770 may be operable to generate digital and/or analog signals. In this manner, the LOGEN 770 may be operable to generate one or more clock signals and/or sinusoidal signals. Characteristics of the oscillating signals such as the frequency and duty cycle may be determined based on one or more control signals from, for example, the processor 760 and/or the baseband processing module 740.

In operation, the processor 760 may configure the various components of the wireless communication device 700 based on a wireless standard according to which it is desired to receive signals. Wireless signals may be received via the RF antenna 710, amplified, and downconverted by the receiver 720. The baseband processing module 740 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device 700, data to be stored to the memory 750, and/or information affecting and/or enabling operation of the wireless communication device 700. The baseband processing module 740 may modulate, encode, and perform other processing on audio, video, and/or control signals to be transmitted by the transmitter 730 in accordance with various wireless standards.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

Various functions described above can be implemented in digital electronic circuitry, as well as, in computer software, firmware or hardware. The techniques can be implemented by using one or more computer program products. Programmable processors and computers can be included in or packaged as mobile devices. The processes and logic flows can be performed by one or more programmable processors and by one or more programmable logic circuitries. General and special-purpose computing devices and storage devices can be interconnected through communication networks.

Some implementations include electronic components, such as microprocessors and storage and memory that store computer program instructions in a machine-readable or computer-readable medium (alternatively referred to as computer-readable storage media, machine-readable media, or machine-readable storage media). Some examples of such computer-readable media include RAM, ROM or flash memory. The computer-readable media can store a computer program that is executable by at least one processing unit and include sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multicore processors that execute software, some implementations are performed by one or more integrated circuits, such as application-specific integrated circuits (ASICs) or field-programmable gate arrays (FPGAs). In some implementations, such integrated circuits execute instructions that are stored on the circuit itself.

As used in this specification and any claims of this application, the terms "computer", "processor," and "memory" all refer to electronic or other technological devices. These terms exclude people or groups of people. For the purposes of the specification, the terms "display" or "displaying" mean displaying on an electronic device. As used in this specification and any claims of this application, the terms "computer-readable medium" and "computer-readable media" are entirely restricted to tangible, physical objects that store information in a form that is readable by a computer. These terms exclude any wireless signals, wired download signals, and any other ephemeral signals.

To provide for interaction with a user, implementations of the subject matter described in this specification can be implemented on a computer having a display device as described herein for displaying information to the user and a keyboard and a pointing device, such as a mouse or a trackball, by which the user can provide input to the computer. Other kinds of devices can be used to provide for interaction with a user as well; for example, feedback provided to the user can be any form of sensory feedback, such as visual feedback, auditory feedback, or tactile feedback. Input from the user can be received in any form, including acoustic, speech, or tactile input.

Many of the above-described features and applications are implemented as software processes that are specified as a set of instructions recorded on a computer-readable storage medium (also referred to as a computer-readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, flash drives, RAM chips, hard drives, EPROMs, etc. The computer-readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some implementations, multiple software aspects of the subject disclosure can be implemented as subparts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages and declarative or procedural languages, and it can be deployed in any form, including as a standalone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Some of the blocks may be performed simultaneously. For example, in certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its), and vice versa. Headings and subheadings, if any, are used for convenience only and do not limit the subject disclosure.

The predicate words "configured to," "operable to," and "programmed to" do not imply any particular tangible or intangible modification of a subject, but rather are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects, and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations, and vice versa.

The word "example" is used herein to mean "serving as an example or illustration." Any aspect or design described herein as an "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for," or, in the case of a method claim, the element is recited using the phrase "step for." Furthermore, to the extent that the terms "include," "have," or the like are used in the description or the claims, such terms are intended to be inclusive in a manner similar to the term "comprise," as "comprise" is interpreted when employed as a transitional word in a claim.

What is claimed is:

1. A device comprising:
a microphone;
a sidetone filter configured to:
receive an audio signal from the microphone, the audio signal comprising ambient noise and a voice of a user of the device; and
filter at least a portion of the ambient noise from the audio signal to generate a sidetone signal; and
a processor configured to:
process the audio signal from the microphone received by the sidetone filter including determining a level of the ambient noise in the audio signal from the microphone received by the sidetone filter;
control a frequency band of the sidetone filter based on the ambient noise in the audio signal; and
dynamically adjust a gain applied to the sidetone signal based on the level of the ambient noise.

2. The device of claim 1, wherein the processor is configured to dynamically estimate the level of the ambient noise and increase the gain applied to the sidetone signal when the level of the ambient noise is below a first predefined threshold.

3. The device of claim 1, wherein the processor is configured to dynamically estimate the level of the ambient noise and decrease the gain applied to the sidetone signal when the level of the ambient noise is above a second predefined threshold.

4. The device of claim 1, wherein the control of the frequency band of the sidetone filter is based on the level of the ambient noise.

5. The device of claim 1, wherein the device comprises a headphone and the voice comprises a self-voice of the user while being on a phone call.

6. The device of claim 5, wherein the microphone comprises a plurality of microphones embedded in the headphone.

7. The device of claim 6, wherein the processor comprises a second filter configured to estimate a near-end noise.

8. The device of claim 7, further comprising an equalizer configured to balance frequency components of an output of the second filter.

9. A device comprising:
a microphone;
a filter configured to:
receive an audio signal from the microphone, the audio signal comprising ambient noise and one or more sounds; and
filter at least a portion of the ambient noise from the audio signal with a sidetone filter to generate a filtered signal; and
a processor configured to:
determine a level of the ambient noise in the audio signal received by the filter;
dynamically adjust a gain applied to the filtered signal based on the level of the ambient noise; and
dynamically control operational characteristics of the sidetone filter based on the ambient noise.

10. The device of claim 9, wherein the processor is further configured to dynamically adjust a gain applied to the filtered audio signal based on the level of the ambient noise.

11. The device of claim 9, wherein the processor is further configured to dynamically estimate a level and a frequency spectrum of the ambient noise and adjust the operational characteristics of the filter based the estimated level and frequency spectrum of the ambient noise.

12. The device of claim 9, wherein the operational characteristics of the filter include a mid-band frequency and a bandwidth.

13. The device of claim 9, wherein the device comprises a headset and the one or more sounds comprise one of a self-voice of a user while being on a phone call or a surround sound.

14. The device of claim 9, wherein the processor is further configured to separate a sidetone signal from the audio signal and forward the sidetone signal to a gain stage through an equalizer configured to adjust a balance between frequency components of the sidetone signal before amplification by the gain stage.

15. A method comprising:
receiving an audio signal from a microphone, the audio signal comprising ambient noise and one or more audio components;
filtering at least a portion of the ambient noise from the audio signal by a sidetone filter to generate a filtered audio signal containing the one or more audio components; and
process the audio signal from the microphone received by the sidetone filter including determining a level of the ambient noise in the audio signal received from the microphone;
control a frequency band of the sidetone filter based on the ambient noise in the audio signal; and
dynamically adjusting a gain applied to the filtered audio signal based on the level of the ambient noise.

16. The method of claim 15, further comprising dynamically estimating a level of the ambient noise and adjusting a gain of a gain stage that amplifies the filtered audio signal based on the estimated level of the ambient noise.

17. The method of claim 16, further comprising dynamically estimating a frequency spectrum of the ambient noise and adjusting the frequency band of the filter based on the estimated level and the frequency spectrum of the ambient noise.

18. The method of claim 15, wherein the one or more audio components comprises a sidetone signal including a voice of a user while being on a phone call, and the method further comprises adjusting a balance between frequency components of the sidetone signal before amplification of the sidetone signal by a gain stage.

19. The method of claim 18, further comprising adding the amplified sidetone signal to a cross-faded signal, produced by cross-fading outputs of an active noise cancellation signal and a transparency filter, a feedback signal and a downlink signal, to generate a mixed audio signal.

20. The method of claim 19, further comprising passing the mixed audio signal through a soft clip to a speaker, wherein the feedback signal is generated by an active noise cancellation filter coupled to a microphone adjacent to the speaker.

* * * * *